(12) United States Patent
Charley

(10) Patent No.: US 9,899,153 B2
(45) Date of Patent: Feb. 20, 2018

(54) BARIUM STRONTIUM-TITANIUM (BST) CAPACITOR CONFIGURATION METHOD

(71) Applicant: STMicroelectronics (Tours) SAS, Tours (FR)

(72) Inventor: Sylvain Charley, Mettray (FR)

(73) Assignee: STMicroelectronics (Tours) SAS, Tours (FR)

( * ) Notice: Subject to any disclaimer, the term of this patent is extended or adjusted under 35 U.S.C. 154(b) by 222 days.

(21) Appl. No.: 14/964,654

(22) Filed: Dec. 10, 2015

(65) Prior Publication Data
US 2016/0372266 A1 Dec. 22, 2016

(30) Foreign Application Priority Data

Jun. 22, 2015 (FR) ...................................... 15 55716

(51) Int. Cl.
| | |
|---|---|
| *H01G 7/06* | (2006.01) |
| *G01R 15/16* | (2006.01) |
| *G05F 5/00* | (2006.01) |
| *H03H 5/12* | (2006.01) |
| *H03H 7/01* | (2006.01) |
| *H04B 1/04* | (2006.01) |

(52) U.S. Cl.
CPC ............. *H01G 7/06* (2013.01); *G01R 15/165* (2013.01); *G05F 5/00* (2013.01); *H03H 5/12* (2013.01); *H03H 7/0153* (2013.01); *H04B 1/0458* (2013.01)

(58) Field of Classification Search
CPC ....... H04B 1/0458; H03H 7/0153; H03H 5/12
See application file for complete search history.

(56) References Cited

U.S. PATENT DOCUMENTS

2015/0137616 A1   5/2015   Charley

FOREIGN PATENT DOCUMENTS

| | | |
|---|---|---|
| CN | 202453426 U | 9/2012 |
| EP | 2690795 A1 | 1/2014 |
| FR | 3013537 A1 | 5/2015 |

OTHER PUBLICATIONS

CN First Office Action and Search Report for co-pending Appl. No. CN 201510830559.1 dated May 11, 2017 (6 pages).
INPI Search Report and Written Opinion for FR 1555716 dated Apr. 21, 2016 (7 pages).

*Primary Examiner* — Robert Deberadinis
(74) *Attorney, Agent, or Firm* — Gardere Wynne Sewell LLP

(57) ABSTRACT

A capacitor has a variable capacitance settable by a bias voltage. A method for setting the bias voltage including the steps of: (a) injecting a constant current to bias the capacitor; (b) measuring the capacitor voltage at the end of a time interval; (c) calculating the capacitance value obtained at the end of the time interval; (d) comparing this value with a desired value; and (e) repeating steps (a) to (d) so as long as the calculated value is different from the set point value. When calculated value matches the set point value; the measured capacitor voltage is stored as a bias voltage to be applied to the capacitor for setting the variable capacitance.

14 Claims, 3 Drawing Sheets

BARIUM STRONTIUM-TITANIUM (BST) CAPACITOR CONFIGURATION METHOD

PRIORITY CLAIM

This application claims the priority benefit of French Application for Patent No. 1555716, filed on Jun. 22, 2015, herein incorporated by reference in its entirety to the maximum extent allowable by law.

TECHNICAL FIELD

The present disclosure generally relates to electronic circuits and, more specifically, to the control of a capacitor having a value settable by application of a bias voltage. The present disclosure more specifically applies to the control of BST (Barium-Strontium-Titanium) capacitors.

BACKGROUND

BST capacitors have essentially been developed for radio frequency applications, in particular for mobile telephony. Having a capacitor with an analogically-adjustable capacitance significantly improves the performance, since it enables to adapt the device comprising such a capacitor to the outside environment.

A BST capacitor appears in the form of an integrated circuit (this type of capacitor is also called adjustable integrated capacitor). The capacitance of a BST capacitor is set by the value of a DC bias potential which is applied thereto, generally in a range from a few volts to a few tens of volts, typically between 2 and 20 volts.

The bias voltage of a BST capacitor is generally provided by a dedicated control circuit, performing a high-voltage digital-to-analog conversion, that is, converting a digital configuration word (generally, a byte) into a DC analog voltage to be applied to the capacitor to set its capacitance.

The control or configuration of a BST capacitor now suffers from inaccuracies due, among others, to manufacturing tolerances and temperature-related variations and variations related to the capacitor hysteresis.

SUMMARY

An embodiment of the present disclosure provides a method of configuring a BST capacitor which overcomes all or part of the disadvantages of usual configuration methods.

An embodiment provides a solution capable of taking into account variations due to the hysteresis of the dielectric material of the capacitor.

An embodiment provides a method compatible with usual BST capacitor control circuits.

Thus, an embodiment provides a method of configuring a capacitor having a capacitance settable by biasing, to a set point value, comprising the steps of: (a) injecting a constant current to bias the capacitor; (b) measuring the capacitor bias voltage at the end of a time interval; (c) calculating the value of the capacitance obtained at the end of the time interval; (d) comparing this value with a desired value; (e) repeating steps (a) to (d) as long as the calculated value is different from the set point value; and storing the value of the measured bias voltage as being the bias voltage to be applied to the capacitor as soon as the calculated capacitance value is equal to the set point value.

According to an embodiment, the calculation step applies the following formula:

$$\Delta C = Ic^* \Delta T / \Delta V,$$

where Ic represents the value of the constant current, and where $\Delta V$ and $\Delta C$ respectively represent the variation of the measured voltage and the capacitance variation between the end and the beginning of time interval $\Delta T$.

According to an embodiment, the initial voltage is zero.

According to an embodiment, the formula becomes:

$$C = Ic^* \Sigma \Delta T / V \text{bias},$$

where C represents the calculated capacitance and Vbias represents the measured voltage.

According to an embodiment, the time interval is the same for all occurrences.

According to an embodiment, the time interval varies from one occurrence to the other.

According to an embodiment, the amplitude of the current is a function of the desired capacitance variation.

According to an embodiment, the direction of the current depends on the variation direction desired for the capacitance value.

According to an embodiment, the time interval is in the range from 50 to 700 milliseconds.

According to an embodiment, the constant current has a value in the range from 10 microamperes to 500 microamperes.

According to an embodiment, the method is implemented each time the value of the BST capacitor needs to be modified.

An embodiment also provides a circuit for controlling a capacitor having a capacitance settable by biasing, capable of implementing the described method.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
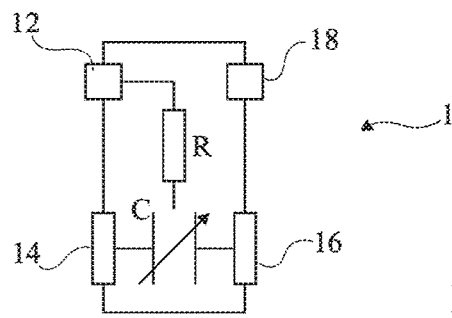
FIG. 1 is a simplified representation of a BST capacitor.

The same elements have been designated with the same reference numerals in the different drawings. For clarity, only those elements which are useful to the understanding of the embodiments which will be described have been shown and will be detailed. In particular, the forming of a BST capacitor as well as of the other portions of the control circuit has not been detailed, the described embodiments being compatible with usual applications of capacitors settable by application of a bias voltage (for example, BST capacitors) and with usual formings of the rest of the control circuit. Further, the different possible applications of a BST capacitor have not been detailed either, the described embodiments being here again compatible with usual applications. In the following description, expressions "approximately", "about", and "in the order of" mean to within 10%, preferably to within 5%.

FIG. 1 is a simplified representation of an integrated circuit 1 forming a BST capacitor. This circuit generally comprises at least three terminals 12, 14, and 16. In practice, for industrial manufacturing reasons, the integrated circuit package may comprise other terminals 18 which are not intended to be connected. Terminals 14 and 16 define terminals corresponding to the electrodes of capacitor C intended to be connected to the radio frequency application. Further, one of terminals 14 and 16 is grounded. According to the application, such a connection is direct, or (case of a capacitor used in series in the radio frequency chain) achieved via an inductive element. Terminal 12 defines a terminal of application of a bias potential Vbias setting the capacitance value of capacitor C. From an electrical point of view, this bias potential is applied via a resistor R.

Figure 2:
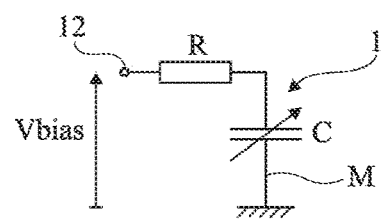
FIG. 2 is an equivalent electric diagram of a capacitor having a capacitance settable by biasing.

FIG. 2 shows the equivalent electric diagram of a BST capacitor 1. Resistor R of application of bias voltage Vbias forms, with capacitor C, a series RC circuit between terminal 12 of application of voltage Vbias and, in this example, ground M.

Figure 3:
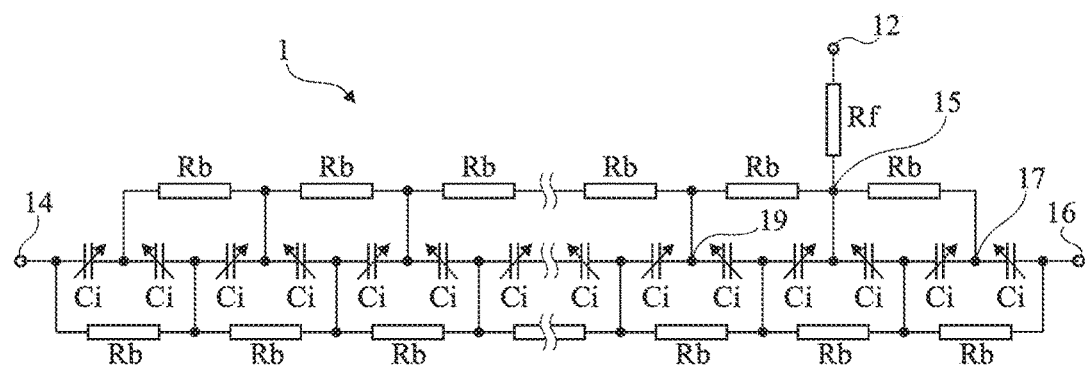
FIG. 3 is a detailed electric diagram of an embodiment of a capacitor having a capacitance settable by biasing.

FIG. 3 shows an example of a detailed electric diagram of a capacitor having a capacitance settable by biasing. Capacitor 1 comprises a plurality of series-connected capacitive elements Ci, for example, all having the same value. This series connection is achieved between terminals 14 and 16. The number of capacitive elements Ci conditions the linearity of the formed capacitor. The larger this number, the better the linearity of the radio frequency signal, this signal being divided between all capacitive elements Ci. For example, from eight to forty-eight elements Ci are provided. Resistive biasing elements Rb connect capacitive elements Ci two by two. Thus, for a number n of series-connected capacitive elements Ci, capacitor 1 comprises n−1 resistors Rb. Although this is not compulsory, the number of capacitive elements Ci is generally even to optimize the integrated circuit surface area. A resistor Rf of application of signal Vbias connects terminal 12 to an interconnect between two of resistors Rb as well as to the junction point of the two capacitive elements Ci at the level of this interconnect. In the example of FIG. 3, starting from terminal 12, resistor Rf is connected between the third and fourth capacitive elements Ci, and thus to junction point 15 of two resistors Rb which are series-connected between junction point 17 of the first and second capacitive elements and junction point 19 of the fifth and sixth capacitive elements.

A difficulty in the control or configuration of a BST capacitor to set its value is that different parameters introduce variations of the resulting capacitance for a same set point voltage. Among such parameters, one should note manufacturing tolerances, variations of the capacitance value according to temperature as well as hysteresis-related variations (for a given set point value, the resulting capacitance may differ according to whether the capacitance is increased or decreased with respect to the initial value).

It could have been devised to control the set point voltage according to the result obtained in the radio frequency application, for example according to the cut-off frequency obtained with the settable capacitance in this application. However, such a solution would be particularly complex, requiring measurement elements at the level of the actual radio frequency application. Moreover, programs for controlling such a synchronization would also be particularly complex.

To take into account manufacturing tolerances and temperature variations, it could be devised to integrate, in a same chip, the BST capacitor(s) to be controlled and their control circuit (in particular, the digital-to-analog converter). However, such a solution suffers from a lack of flexibility between the control circuit and the capacitors, which limits possible applications. Further, this would not enable to take into account the capacitance variation due to the hysteresis of the dielectric material used.

Figure 4:
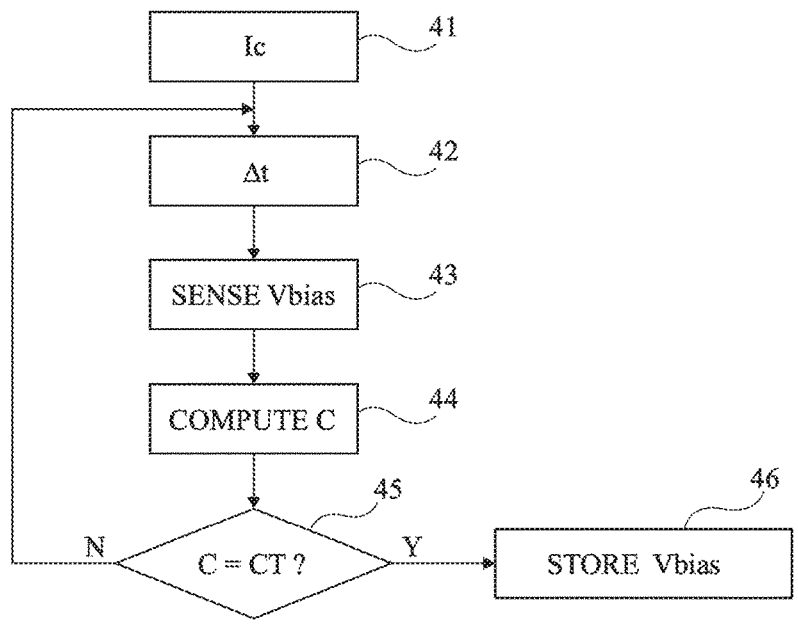
FIG. 4 illustrates, in the form of flow blocks, steps of an implementation mode of the method of configuring a capacitor having a capacitance settable by biasing.

FIG. 4 is a flow diagram illustrating an embodiment of the method of configuring the capacitance value and, more specifically, of determining the bias voltage to be applied to obtain the desired capacitance value (set point value).

Figure 5A:
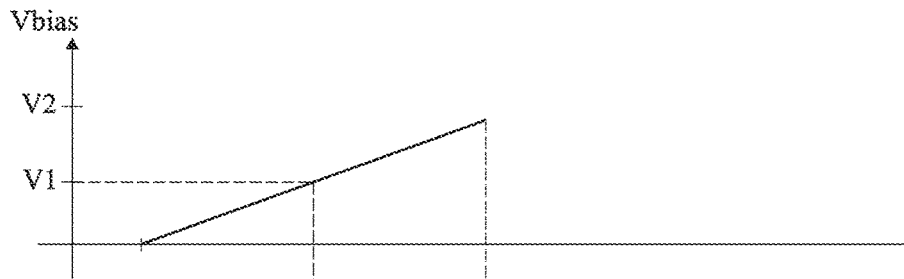
FIGS. 5A to 5C are timing diagrams illustrating the implementation of the configuration method of FIG. 4.
Figure 5B:
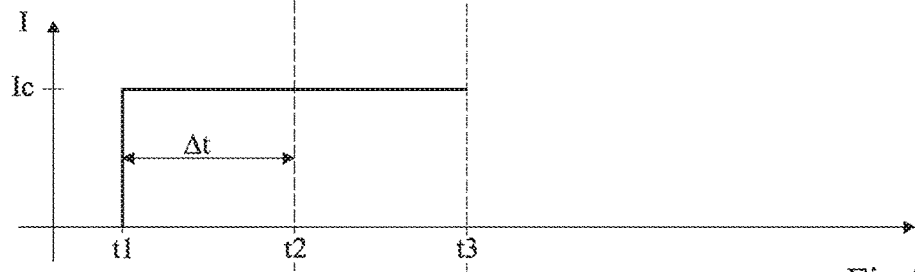
Figure 5C:
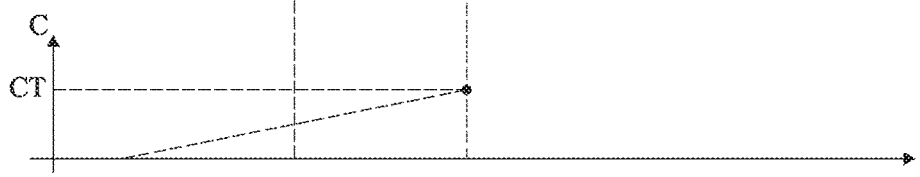

FIGS. 5A, 5B, and 5C are timing diagrams illustrating the implementation of the method of FIG. 4. FIG. 5A illustrates an example of variation of bias voltage Vbias between terminal 12 and ground M. FIG. 5B illustrates the variation of a current I injected into the BST capacitor. FIG. 5C illustrates the variation of the obtained value of capacitance C.

According to the method of FIG. 4, it is provided to inject (block 41, Ic) a constant current Ic into the BST capacitor. This current is injected for a determined time period (block 42, Δt). At the end of delay 42 (block 43, SENSE Vbias) the value of the bias voltage of the BST capacitor, that is, the voltage value between terminals 12 and M, is measured.

Based on this measured value Vbias, on the known values of current Ic and of time interval ΔT, the capacitance obtained at the end of the biasing is then calculated (block 44, COMPUTE C). This value is calculated by application of the following formula:

$$C = Ic * \Delta T / \Delta V,$$

where ΔV shows the bias voltage variation between the end and the beginning of the application of the constant current.

Then (block 45, C=CT?), the value of capacitance C obtained by calculation is compared with the set point value desired for this capacitance, which corresponds to the digital word provided to the control circuit. If the desired value is reached, that is, the measured value is equal to the desired set point (output Y of block 45), the value of the voltage measured at step 43 is stored (block 46, STORE Vbias) as being the bias value to be applied to the BST capacitor to obtain the desired capacitance. If not, the process returns to the input of block 42, that is, to wait for an additional time interval and a new Vbias and capacitance are obtained as the process repeats.

In FIGS. 5A and 5C, a zero initial capacitance is assumed. Constant current Ic is applied from a time t1 and a first measurement is performed at a time t2 subsequent to time ΔT. It is assumed that at this time t2, the measured value V1 of voltage Vbias results in a capacitance result which remains lower than the desired capacitance CT. Current Ic thus keeps on being applied until subsequent time t3, distant by the same time interval ΔT in this example. In FIGS. 5A to 5C, it is assumed that at time t3, measurement V2 of voltage Vbias results in a capacitance value reaching set point value CT. This value V2 is then stored as being the biasing to be applied.

In the representation of FIGS. 5A to 5C, linear variations of the different variables have been assumed for simplification. It should be noted that in practice, such variations are however not linear.

For the case where the initial capacitance value is not zero, that is, the desired variation starts from a non-zero bias value Vbias, this value is taken into account to calculate voltage variation ΔV. It is indeed not necessary to systematically take back the capacitance to its zero value. The calculations may be performed on variations of voltage ΔV by calculating:

$$\Delta C = Ic * \Delta T/\Delta V,$$

where ΔV shows the variation of the capacitance measured between two ends of time interval ΔT.

In the case where the capacitance needs to be decreased, a method similar to that described hereabove with a negative current Ic is applied.

Starting from zero initial values for voltage Vbias and capacitance C, the time intervals may be accumulated and the following may be calculated:

$$C = Ic * \Sigma \Delta T/V\text{bias},$$

In practice, the range of values of current Ic is predetermined according to the capacitance range desired for the application. Current Ic is positive or negative according to the desired capacitance value ΔC. Current Ic may also be adjusted according to this desired variation ΔC to decrease the time of transition between the initial capacitance value and the final value. As a specific example, this value may be in the range from 10 microamperes to 500 microamperes. Similarly, time interval ΔT depends on the variations desired at the capacitance level according to the application and also on the granularity desired for the setting. The shorter the time interval, the finer the determination of the capacitance, but the more time is taken by the application of the method and thus the setting of the value. A duration in the range from approximately 50 to 700 microseconds is an acceptable tradeoff. The configuration method is preferably applied each time the application needs a setting of the capacitance, whether to set an absolute value from the origin or a variation after a change of configuration in the application.

Figure 6:
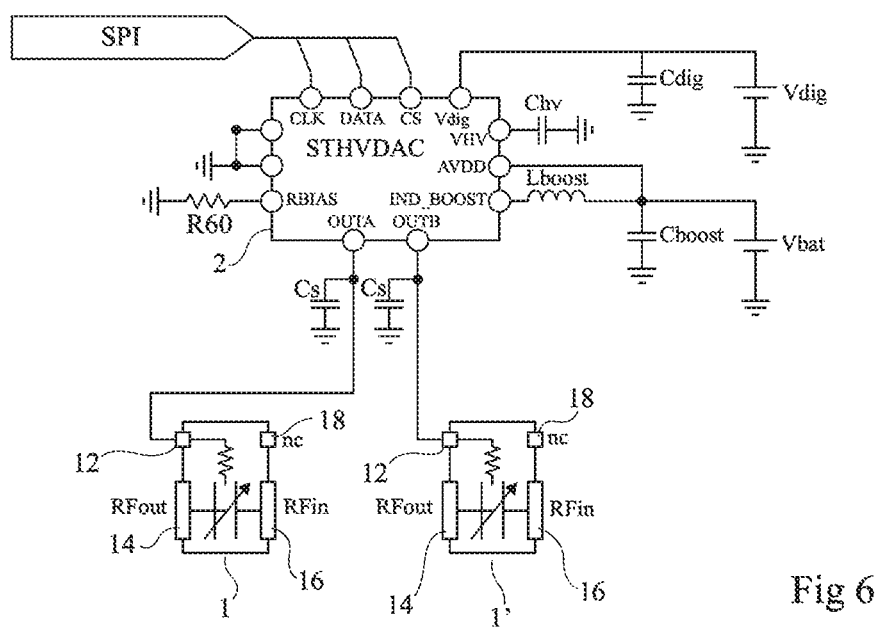
FIG. 6 is a simplified representation of a control circuit associated with BST capacitors.

FIG. 6 is a simplified representation of a circuit 2 for controlling capacitors settable by biasing. The circuit of FIG. 6 is based on the use of an integrated high-voltage digital-to-analog converter (STHVDAC). Two voltages, respectively a digital power supply voltage Vdig (for example, 1.8 volts) and an analog power supply voltage Vbat (for example, 3.6 volts) are applied to terminals Vdig and AVDD of circuit 2. A filtering element Cdig may be connected between terminal Vdig and the ground. The digital reference (data word) originates from other circuits, not shown, of the application and is, in this example, provided by a serial bus SPI of three conductors CLK, DATA, and CS of circuit 2. A terminal IND_BOOST receives voltage Vbat via an inductive element Lboost and a capacitor Cboost is connected in parallel on voltage Vbat. This assembly has the function of powering a voltage step-up stage generating the bias voltage required to control BST capacitors. In the example of FIG. 6, two BST capacitors 1 and 1' connected to two terminals OUTA and OUTB are considered. A resistor R60 grounds a terminal RBIAS and a capacitor Chv grounds a terminal VHV (receiving the high voltage generated by the step-up stage). Finally, a capacitor Cs connects each terminal OUTA, OUTB to ground to stabilize the respective bias voltages of BST capacitors 1 and 1'. Other terminals of this circuit are capable of being further grounded. The elements described hereabove in relation with FIG. 6 form usual elements of a BST capacitor biasing circuit. The representation of FIG. 6 is an arbitrary example and other control circuits may apply to the described embodiment.

According to an embodiment, a digital-to-analog converter of the type described hereabove is programmed to implement the configuration method. This programming is for example performed via a microcontroller programmed to communicate set point words capable of applying a constant current via a current source (not shown) associated with circuit 2. Thus, the described embodiments are compatible with usual digital-to-analog BST capacitor control circuits. For example, for a current control, the BST capacitor is series-connected with a constant current source, activated (for example, via a switch interposed between the current source and the capacitor) when the capacitance needs to be varied. The time taken by the current source to charge the capacitor depends on the variation desired for the capacitance value.

An advantage of the described embodiments is that the accuracy of the setting of the BST capacitor capacitance value is improved. In particular, the accuracy depends on the accuracy of the control circuit but is made independent from manufacturing tolerances of the BST capacitor, from variations of its capacitance according to temperature, and on the hysteresis of dielectric material. It can now be envisaged to achieve accuracies in the order of one percent with control circuits in integrated circuit form.

Various embodiments have been described. Various alterations, modifications, and improvements will occur to those skilled in the art. In particular, the selection of the constant current value as well as of the time ranges depends on the application. It should be noted on this regard that it is also possible to provide variable time ranges (for example, decreasing as it is come closer to the set point value desired to obtain a fine setting). Further, the practical implementation of the embodiments which have been described is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of configuring a capacitor, having a capacitance settable by biasing, to a set point value, comprising the steps of:
    (a) injecting a constant current to bias the capacitor;
    (b) measuring a capacitor bias voltage at the end of a time interval;
    (c) calculating a capacitance value at the end of the time interval;
    (d) comparing the capacitance value with a desired capacitance value;
    (e) repeating steps (a) to (d) as long as the calculated capacitance value is different from the desired capacitance value; and
    storing a value of the measured capacitor bias voltage as a bias voltage to be applied to the capacitor as soon as the calculated capacitance value is equal to the desired capacitance value.

2. The method of claim 1, wherein the calculation step applies the following formula:

$$\Delta C = Ic * \Delta T/\Delta V,$$

where Ic represents the value of the constant current, and where ΔV and ΔC respectively represent the variation of the measured voltage and the capacitance variation between the end and the beginning of the time interval ΔT.

3. The method of claim 2, wherein the initial voltage is zero.

4. The method of claim 3, wherein the formula becomes:

$$C = I_c * \Sigma \Delta T / V_{bias},$$

where C represents the calculated capacitance and Vbias represents the measured voltage.

5. The method of claim 1, wherein the time interval is the same for each repeat of steps (a) to (d).

6. The method of claim 1, wherein the time interval varies same for each repeat of steps (a) to (d).

7. The method of claim 1, wherein an amplitude of the current is a function of a desired capacitance variation.

8. The method of claim 1, wherein a direction of the current depends on a desired variation direction for the capacitance value.

9. The method of claim 1, wherein the time interval is in a range from 50 to 700 milliseconds.

10. The method of claim 1, wherein the constant current has a value in a range from 10 microamperes to 500 microamperes.

11. The method of claim 1, wherein steps (a)-(e) are implemented each time the capacitance of the capacitor needs to be modified.

12. The method of claim 1, wherein the capacitor is a BST (Barium-Strontium-Titanium) capacitor.

13. A circuit for controlling a capacitor having a capacitance settable by biasing, said circuit configured to implement the method of claim 1.

14. A method, comprising the steps of:
(a) injecting a constant current to a control input of a Barium-Strontium-Titanium (BST) variable capacitor;
(b) measuring a voltage at the control input at the end of a time interval;
(c) calculating a capacitance value of the BST variable capacitor at the end of the time interval as a function of the constant current, voltage and time interval;
(d) determining if the capacitance value matches a desired capacitance value; and
(e) if yes from step (d), storing the voltage as a bias voltage for application to the control input of the BST variable capacitor so as to set a variable capacitance of the BST variable capacitor.

\* \* \* \* \*